United States Patent
Tsai et al.

(10) Patent No.: US 9,496,149 B2
(45) Date of Patent: Nov. 15, 2016

(54) SEMICONDUCTOR DEVICES AND METHODS FOR MANUFACTURING THE SAME

(71) Applicant: Taiwan Semiconductor Manufacturing Company, Ltd., Hsin-Chu (TW)

(72) Inventors: Chun Hsiung Tsai, Xinpu Township (TW); Tsz-Mei Kwok, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 58 days.

(21) Appl. No.: 14/251,830

(22) Filed: Apr. 14, 2014

(65) Prior Publication Data
US 2015/0294865 A1    Oct. 15, 2015

(51) Int. Cl.
| H01L 21/8238 | (2006.01) |
| H01L 21/311  | (2006.01) |
| H01L 29/06   | (2006.01) |
| H01L 29/36   | (2006.01) |
| H01L 21/02   | (2006.01) |

(52) U.S. Cl.
CPC ...... *H01L 21/31111* (2013.01); *H01L 21/0243* (2013.01); *H01L 21/0245* (2013.01); *H01L 21/0262* (2013.01); *H01L 21/02532* (2013.01); *H01L 21/02664* (2013.01); *H01L 29/0657* (2013.01); *H01L 29/36* (2013.01)

(58) Field of Classification Search
CPC ..................... H01L 21/31111; H01L 21/0262; H01L 21/0245; H01L 21/02664; H01L 21/0243; H01L 21/02532; H01L 29/36; H01L 29/0657
See application file for complete search history.

(56) References Cited

U.S. PATENT DOCUMENTS

| 6,235,568 B1 * | 5/2001 | Murthy ............ H01L 21/82381 257/E21.634 |
| 8,358,012 B2 * | 1/2013 | Haran ............... H01L 21/28518 257/382 |
| 8,754,448 B2 * | 6/2014 | Liao ................. H01L 21/823412 117/21 |
| 8,878,300 B1 * | 11/2014 | Liu ....................... H01L 29/785 257/368 |
| 9,112,057 B1 * | 8/2015 | Pradhan ............. H01L 29/1079 |
| 2002/0014640 A1 * | 2/2002 | Mitlehner ............ H01L 29/8083 257/256 |
| 2002/0019099 A1 * | 2/2002 | Williams ............. H01L 27/0255 438/270 |

(Continued)

FOREIGN PATENT DOCUMENTS

| KR | 20030002519 A | 1/2003 |
| KR | 20040013265 A | 2/2004 |

(Continued)

OTHER PUBLICATIONS

Van Gelder, W., et al., "The Etching of Silicon Nitride in Phosphoric Acid with Silicon Dioxide as a Mask," J. Electrochem. Soc., 114(8) Aug. 1967, pp. 869-872.

(Continued)

*Primary Examiner* — Jarrett Stark
(74) *Attorney, Agent, or Firm* — Slater Matsil, LLP (57) ABSTRACT

Semiconductor devices and methods for manufacturing the same are disclosed. In an embodiment, a method of manufacturing a semiconductor device may include providing a substrate having a recess; epitaxially forming a first layer including a doped semiconductor material within the recess; and epitaxially forming a second layer including an undoped semiconductor material over at least a portion of the recess.

24 Claims, 10 Drawing Sheets

(56) References Cited

U.S. PATENT DOCUMENTS

| | | | | | |
|---|---|---|---|---|---|
| 2003/0219971 | A1* | 11/2003 | Cabral, Jr. | H01L 21/28518 | 438/622 |
| 2006/0199312 | A1* | 9/2006 | Harris | H01L 29/1066 | 438/133 |
| 2007/0155074 | A1* | 7/2007 | Ho | H01L 21/28035 | 438/197 |
| 2007/0200176 | A1* | 8/2007 | Kammler | H01L 29/458 | 257/347 |
| 2007/0235802 | A1* | 10/2007 | Chong | H01L 21/823807 | 257/346 |
| 2008/0203398 | A1* | 8/2008 | Harris | H01L 29/41766 | 257/77 |
| 2008/0206940 | A1* | 8/2008 | Kang | H01L 21/823807 | 438/197 |
| 2008/0210957 | A1* | 9/2008 | Watanabe | H01L 21/0242 | 257/89 |
| 2009/0085125 | A1* | 4/2009 | Kim | H01L 21/823807 | 257/369 |
| 2009/0152634 | A1* | 6/2009 | Grant | H01L 21/28114 | 257/368 |
| 2010/0093147 | A1* | 4/2010 | Liao | H01L 21/28123 | 438/300 |
| 2011/0287600 | A1* | 11/2011 | Cheng | H01L 29/7848 | 438/299 |
| 2011/0287611 | A1* | 11/2011 | Cheng | H01L 21/02532 | 438/478 |
| 2012/0086077 | A1* | 4/2012 | Fried | H01L 21/26586 | 257/347 |
| 2012/0104466 | A1* | 5/2012 | Zhu | H01L 23/485 | 257/255 |
| 2012/0231591 | A1* | 9/2012 | Flachowsky | H01L 21/823807 | 438/231 |
| 2013/0109144 | A1* | 5/2013 | Kim | H01L 21/02532 | 438/301 |
| 2013/0285146 | A1* | 10/2013 | Tung | H01L 21/823807 | 257/368 |
| 2014/0084385 | A1* | 3/2014 | Hoffmann | H01L 29/7833 | 257/402 |
| 2014/0264558 | A1* | 9/2014 | Chandra | H01L 29/36 | 257/329 |
| 2015/0031183 | A1* | 1/2015 | Kang | H01L 21/0245 | 438/285 |
| 2015/0206946 | A1* | 7/2015 | Chen | H01L 29/0847 | 257/384 |
| 2015/0243763 | A1* | 8/2015 | Cheng | H01L 29/66666 | 438/270 |
| 2015/0255578 | A1* | 9/2015 | Chang | H01L 29/7848 | 257/343 |
| 2015/0294865 | A1* | 10/2015 | Tsai | H01L 21/02636 | 257/618 |

FOREIGN PATENT DOCUMENTS

| | | | | |
|---|---|---|---|---|
| KR | 20070081721 A | | 8/2007 | |
| KR | 1020130045716 | | 5/2013 | |
| WO | WO 2013177725 A1 | * | 12/2013 | H01L 29/66636 |

OTHER PUBLICATIONS

Williams, K., et al., "Etch Rates for Micromachining Processing," Journal of MEMS, vol. 5, No. 4, Dec. 1996, 18 pages.

* cited by examiner

SEMICONDUCTOR DEVICES AND METHODS FOR MANUFACTURING THE SAME

BACKGROUND

Semiconductor devices are used in a variety of electronic applications, such as personal computers, cell phones, digital cameras, and other electronic equipment, as examples. Semiconductor devices are typically fabricated by processing a semiconductor substrate, e.g. by sequentially depositing insulating or dielectric layers, conductive layers, and semiconductive layers of material over a semiconductor substrate, and patterning the various material layers using lithography or etching to form circuit components and elements thereon.

Processing the semiconductor substrate may result in an unintended loss of material (e.g. semiconductor material) from a portion of the semiconductor substrate, which may adversely affect the manufactured semiconductor device. There is a need to solve the above-identified problem, and new ways of manufacturing a semiconductor device may be needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 2F show a process flow illustrating a method of manufacturing a semiconductor device including a first layer and a second layer, in accordance with some embodiments.

FIG. 4A to FIG. 4F show a process flow illustrating a method of manufacturing a semiconductor device including a first layer, a second layer, and a third layer, in accordance with some embodiments.

FIG. 5 to FIG. 7 show various semiconductor devices in accordance with some embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
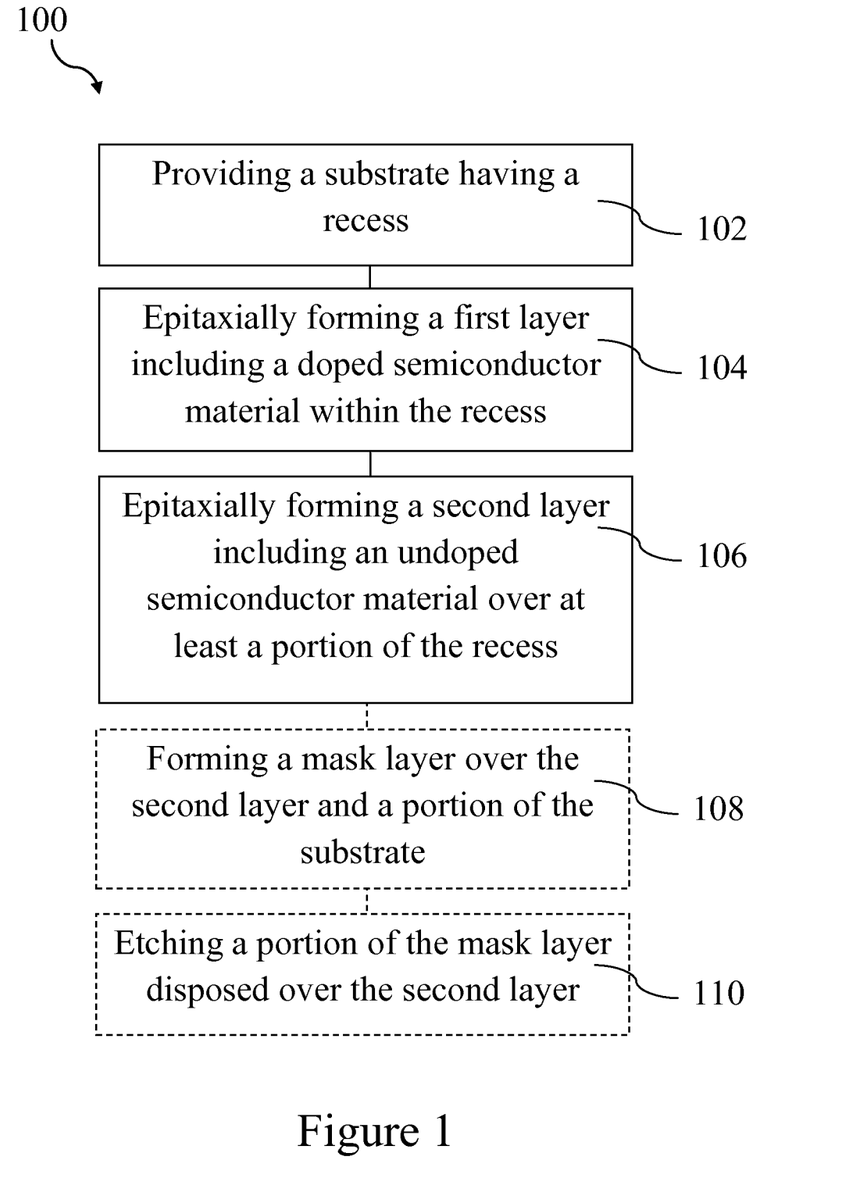
FIG. 1 shows a method of manufacturing a semiconductor device, in accordance with some embodiments.

FIG. 1 shows a method 100 of manufacturing a semiconductor device, in accordance with one or more embodiments.

The method 100 may include providing a substrate having a recess (in 102); epitaxially forming a first layer including a doped semiconductor material within the recess (in 104); and epitaxially forming a second layer including an undoped semiconductor material over at least a portion of the recess (in 106).

The method 100 may optionally include forming a mask layer over the second layer and a portion of the substrate (in 108); and etching a portion of the mask layer disposed over the second layer (in 110).

FIG. 2A to FIG. 2F show a process flow illustrating the method 100 of manufacturing a semiconductor device, in accordance with one or more embodiments.

Figure 2A:
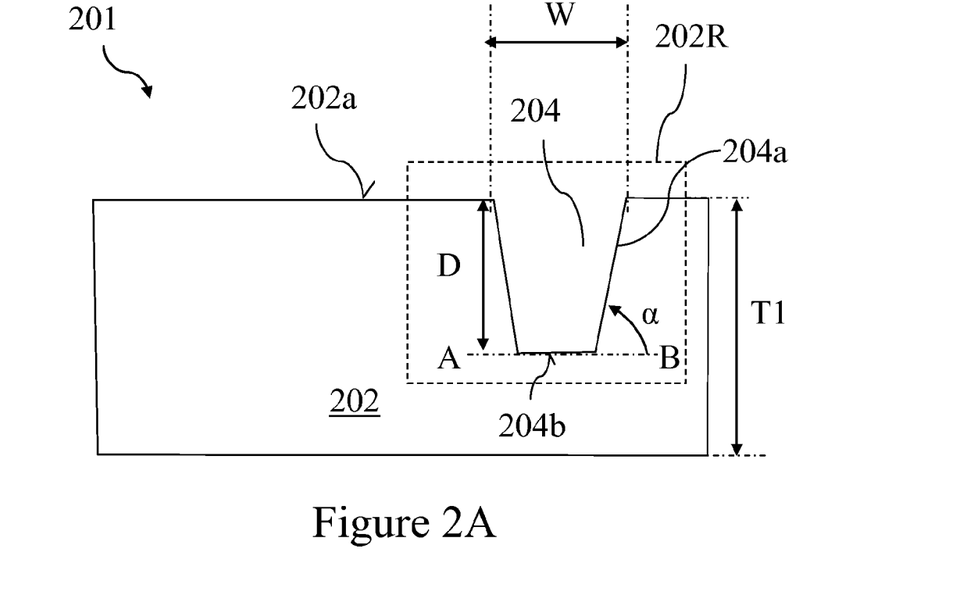

As shown in FIG. 2A in a cross-sectional view 201, the method 100 of manufacturing a semiconductor device may include providing a substrate 202 having a recess 204.

The substrate 202 may have a top surface 202a. In one or more embodiments, the top surface 202a may refer to a surface of the substrate 202 that may be processed (e.g. by etching, by depositing material, etc.).

The substrate 202 may include, or may consist of, a semiconductor material. In accordance with an embodiment, the semiconductor material may include, or may consist of, at least one material selected from a group of materials, the group consisting of: silicon, germanium, gallium nitride, gallium arsenide, and silicon carbide, although other materials may be possible as well in accordance with other embodiments.

In one or more embodiments, the substrate 202 may be a doped substrate, for example, a doped semiconductor substrate. In an embodiment, the doped semiconductor substrate may include, or may be, a doped silicon substrate, a doped germanium substrate, a doped gallium nitride substrate, a doped gallium arsenide substrate, or a doped silicon carbide substrate, although other doped semiconductor substrates may be possible as well in accordance with other embodiments. In this connection, the term "doped substrate" may include an embodiment where the entire substrate 202 is doped, as well as another embodiment where only a part (for example, an upper part) of the substrate 202 is doped.

The substrate 202 may be a p-doped substrate (in other words, a substrate 202 doped with a p-type dopant) or an n-doped substrate (in other words, a substrate 202 doped with an n-type dopant). In accordance with an embodiment, the dopants for doping the substrate 202 may include, or may consist of, at least one material selected from a group of materials, the group consisting of: boron, aluminium, gallium, indium, antimony, phosphorus, arsenic, and antimony, although other materials may be possible as well in accordance with other embodiments. By way of an example, the substrate 202 may be a silicon substrate doped with a p-type dopant such as boron. By way of another example, the substrate 202 may be a silicon substrate doped with an n-type dopant such as phosphorous, arsenic or antimony.

In one or more embodiments, the substrate 202 may include, or may be, a bulk semiconductor substrate.

In one or more embodiments, the substrate 202 may include, or may consist of, a substrate with at least one semiconductor layer such as, for example, a silicon-on-insulator (SOI) semiconductor substrate. In accordance with an embodiment, the at least one semiconductor layer may include, or may consist of, at least one material selected from a group of materials, the group consisting of: silicon, germanium, gallium nitride, gallium arsenide, and silicon carbide, although other materials may be possible as well in accordance with other embodiments.

In one or more embodiments, the substrate 202 may include, or may consist of, a substrate with at least one dielectric layer such as, for example, a silicon-on-insulator (SOI) semiconductor substrate. In accordance with an embodiment, the at least one dielectric layer may include at least one material selected from a group of materials, the group consisting of: an oxide, a nitride and an oxynitride, although other materials may be possible as well in accordance with other embodiments.

As shown in FIG. 2A, the recess 204 may be disposed at the top surface 202a of the substrate 202. For example, a mouth of the recess 204 may be disposed at the top surface 202a of the substrate 202.

In one or more embodiments, the recess 204 may extend partially through the substrate 202. In other words, a depth D of the recess 204 may be less than a thickness T1 of the substrate 202. In an embodiment, the depth D of the recess 204 may be in the range from about 15 nm to about 60 nm, for example in the range from about 20 nm to about 40 nm, for example about 30 nm, although other values may be possible as well in accordance with other embodiments.

The recess 204 may include at least one sidewall 204a and a bottom surface 204b. In accordance with an embodiment, the at least one sidewall 204a of the recess 204 may be slanted. For example, in an embodiment, an angle α subtended by the at least one sidewall 204a and a line parallel to the top surface 202a of the substrate 202 (e.g. the line A-B in FIG. 2A) may be in the range from about 20° to about 70°, for example in the range from about 30° to about 60°, for example about 55°, although other values may be possible as well in accordance with other embodiments.

In accordance with an embodiment, a width W of the recess 204 may be measured as the widest lateral extent of the recess 204. For example, the width W may be measured as the lateral extent of the recess 204 at the top surface 202a of the substrate 202, as shown in the example of FIG. 2A. By way of another example, the width W may be measured as the lateral extent of the mouth of the recess 204, which may be disposed at the top surface 202a of the substrate 202.

In one or more embodiments, the width W of the recess 204 may be in the range from about 30 nm to about 100 nm, for example about 60 nm, although other values may be possible as well in accordance with other embodiments.

In an embodiment, the recess 204 may be formed by means of an etching process. The etching process may include, or may be, at least one of a wet etch process and a dry etch process (e.g. a plasma etch process), or other suitable etching processes.

In accordance with an embodiment, the etching process may be performed in conjunction with a patterned etch mask, which may be formed over a part of the top surface 202a of the substrate 202. The patterned etch mask may be formed by depositing a masking material over the substrate 202, and patterning the masking material to form the patterned etch mask. Patterning the masking material may include, or may consist of, a lithographic process (e.g. a photo-lithographic process). The patterned etch mask may be removed after forming the recess 204.

As shown in FIG. 2A, the recess 204 may be disposed in a region 202R of the substrate 202. In an embodiment, the region 202R may include, or may be, an active region or an active area of the substrate 202. In this connection, the term "active region" or "active area" may include, or may be, a region or an area of the substrate 202 that is defined for further processing (e.g. by etching, by depositing material, etc.). In an embodiment, the region 202R of the substrate 202 in which the recess 204 is disposed may include, or may be, a source region or a drain region of the semiconductor device manufactured according to the method 100 shown in FIG. 1 and/or the process flow shown in FIG. 2A to FIG. 2F.

Figure 2B:
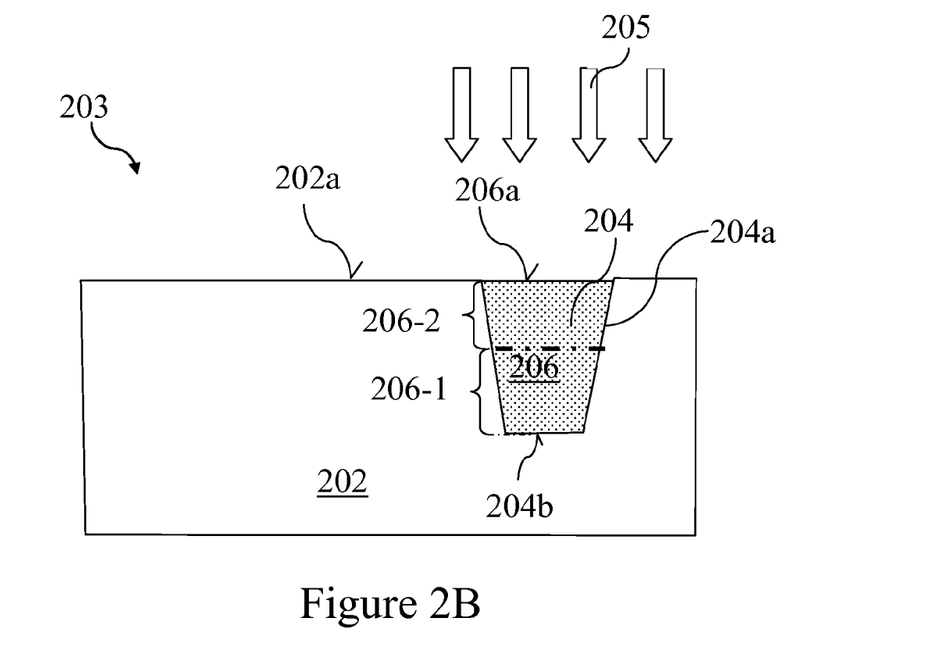

As shown in FIG. 2B in a cross-sectional view 203, the method 100 of manufacturing a semiconductor device may include epitaxially forming a first layer 206 including a doped semiconductor material within the recess 204. The epitaxial process for forming the first layer 206 is shown in FIG. 2B as arrows 205.

In the embodiment shown in FIG. 2B, a top surface 206a of the first layer 206 may be at least substantially flush with the top surface 202a of the substrate 202. In another embodiment, the top surface 206a of the first layer 206 may be disposed at a level lower than the top surface 202a of the substrate 202 (e.g. described below in respect of FIG. 7). In other words, in such an embodiment (e.g. shown in FIG. 7), the top surface 206a of the first layer 206 may be closer to the bottom surface 204b of the recess 204 than the top surface 202a of the substrate 202 is to the bottom surface 204b of the recess 204.

The doped semiconductor material of the first layer 206 may include, or may be, a doped semiconductor material that may be formed (e.g., grown and/or deposited) by means of the epitaxial process 205. In an embodiment, the doped semiconductor material of the first layer 206 may include, or may be, doped silicon, although other doped semiconductor materials (e.g., doped silicon germanium) may be possible as well in accordance with other embodiments.

The doped semiconductor material of the first layer 206 may have a conductivity type that may be different from the conductivity type of the substrate 202.

For example, in an embodiment, the doped semiconductor material of the first layer 206 may include n-type dopants, and the substrate 202 may include, or may be, a semiconductor substrate doped with a p-type dopant. For example, the doped semiconductor material may include, or may be, phosphorus-doped silicon (e.g., Si:P) or arsenic-doped silicon (e.g., Si:As), and the substrate 202 may include, or may be, boron-doped silicon (e.g., Si:B) or boron-doped silicon germanium (e.g., SiGeB).

By way of another example, in an embodiment, the doped semiconductor material of the first layer 206 may include p-type dopants, and the substrate 202 may include, or may be, a semiconductor substrate doped with an n-type dopant. For example, the doped semiconductor material may include, or may be, boron-doped silicon (e.g., SiB) or boron-doped silicon germanium (e.g., SiGeB), and the substrate 202 may include, or may be, phosphorus-doped silicon (e.g., SiP).

A concentration of dopant atoms in the doped semiconductor material of the first layer 206 may be in the range from about $1 \times 10^{20}$ atoms per cubic centimeter to about $3 \times 10^{21}$ atoms per cubic centimeter. For example, in an embodiment, a concentration of phosphorus atoms in a phosphorus-doped semiconductor material (e.g., SiP) of the first layer 206 may be in the range from about $2 \times 10^{20}$ atoms per cubic centimeter to about $2 \times 10^{21}$ atoms per cubic centimeter.

As described above, the first layer 206 may be formed (e.g., grown and/or deposited) by means of the epitaxial process 205. The epitaxial process 205 may include at least one of a liquid phase epitaxial process, a molecular beam epitaxial process, and a vapor phase epitaxial process. For example, in an embodiment, the first layer 206 may be formed (e.g., grown and/or deposited) by means of a vapor phase epitaxial process.

In one or more embodiments, the first layer 206 may include a plurality of sub-layers. Each sub-layer of the plurality of sub-layers of the first layer 206 may be formed by means of the epitaxial process 205.

In an embodiment, the first layer 206 may include a first sub-layer 206-1 proximal the bottom surface 204b of the recess 204 and a second sub-layer 206-2 proximal the top surface 202a of the substrate 202. The top surface 206a of the first layer 206 may include, or may be, a top surface of the second sub-layer 206-2 of the first layer, as shown in the example of FIG. 2B.

Figure 7:
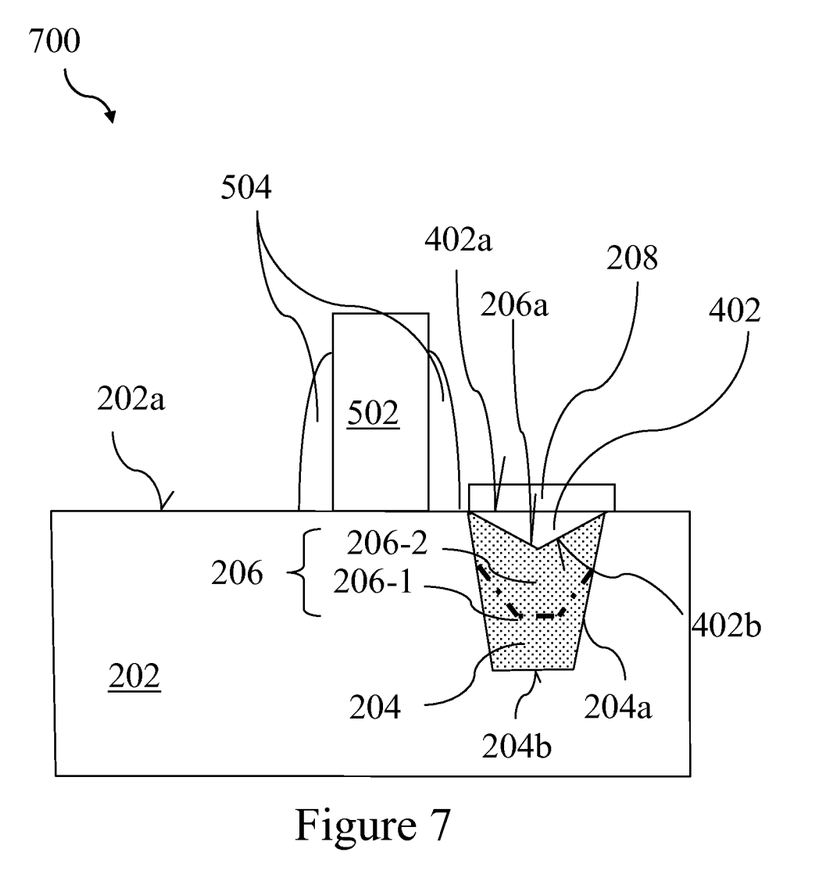

In the embodiment shown in FIG. 2B, the first sub-layer 206-1 and the second sub-layer 206-2 of the first layer 206 may have top surfaces that are at least substantially parallel to the bottom surface 204b of the recess 204 or the top surface 202a of the substrate 202, or both. However, in another embodiment, the top surfaces of the first sub-layer 206-1 and the second sub-layer 206-2 may conform to a contour or shape of the at least one sidewall 204a and bottom surface 204b of the recess 204 (e.g., as shown in the embodiment of FIG. 7).

In an embodiment, a thickness of the first sub-layer 206-1 of the first layer 206 may be in the range from about 5 nanometers to about 10 nanometers, although other thicknesses may be possible as well in accordance with other embodiments. A thickness of the second sub-layer 206-2 of the first layer 206 may be in a range from about 10 nanometers to about 30 nanometers, although other thicknesses may be possible as well in accordance with other embodiments.

In an embodiment, the first layer 206 may include a third sub-layer (not shown in FIG. 2B) disposed over the second sub-layer 206-2. In an embodiment, a top surface of the third sub-layer may be at least substantially flush with (namely, co-planar with) the top surface 202a of the substrate 202. In another embodiment, the top surface of the third sub-layer may be disposed within the recess 204. In such an embodiment, the top surface of the third sub-layer may be at a level lower than the top surface 202a of the substrate 202. In an embodiment, a thickness of the third sub-layer of the first layer 206 may be in the range from about 4 nanometers to about 9 nanometers, although other thicknesses may be possible as well in accordance with other embodiments.

Figure 2C:
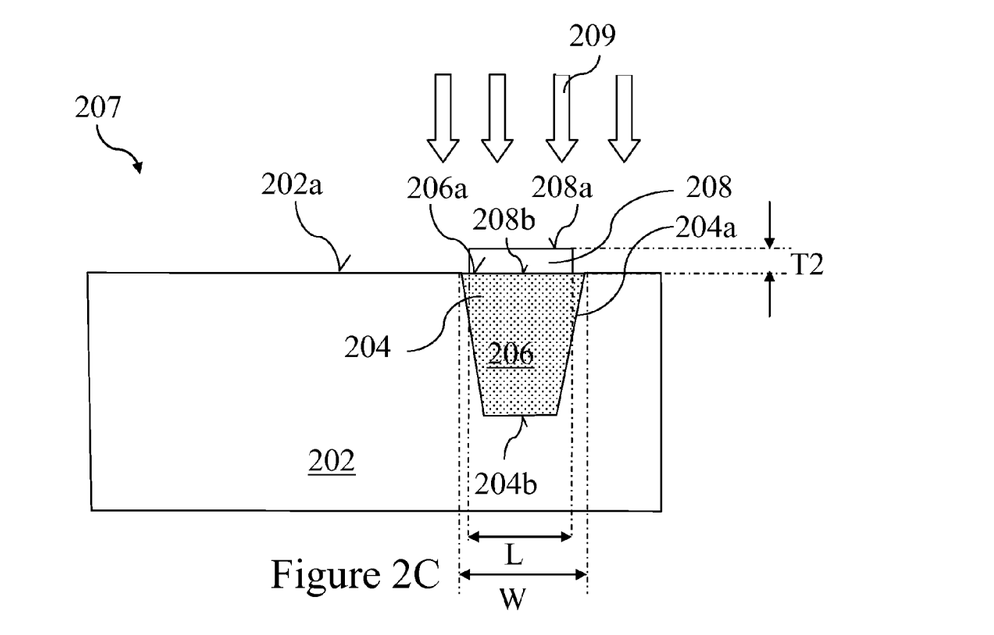

As shown in FIG. 2C in a cross-sectional view 207, the method 100 of manufacturing a semiconductor device may include epitaxially forming a second layer 208 including an undoped semiconductor material over at least a portion of the recess 204. The epitaxial process for forming the second layer 208 is shown in FIG. 2C as arrows 209.

The undoped semiconductor material of the second layer 208 may include, or may be, an undoped semiconductor material that may be formed (e.g., grown and/or deposited) by means of the epitaxial process 209. In an embodiment, the undoped semiconductor material of the second layer 208 may include, or may be, undoped silicon.

The second layer 208 may have a top surface 208a that may be disposed at a level higher than the top surface 202a of the substrate 202. In the embodiment shown in FIG. 2C, a bottom surface 208b of the second layer 208 may be at least substantially flush with (i.e., co-planar with) the top surface 202a of the substrate. However, in another embodiment, the bottom surface 208b of the second layer 208 may be disposed above at a level lower than the top surface 202a of the substrate (e.g., described below in respect of FIG. 7).

In the embodiment shown in FIG. 2C, the bottom surface 208b of the second layer 208 may be in contact with (e.g. direct contact with, e.g. direct physical contact with) the top surface 206a of the first layer 206. However, in another embodiment, the bottom surface 208b of the second layer 208 may be disposed above, and may not be in contact with, the top surface 206a of the first layer 206 (e.g., described below in respect of FIG. 6 and FIG. 7).

A thickness T2 of the second layer 208 may be measured from the bottom surface 208b to the top surface 208a of the second layer 208. The thickness T2 of the second layer 208 may be in a range from about 1 nanometer to about 6 nanometers, for example in a range from about 1 nanometer to about 3 nanometers or in a range from about 2 nanometers to about 5 nanometers.

In an embodiment, the second layer 208 may further include a doped semiconductor material (e.g. doped silicon). In an embodiment, the undoped semiconductor material may be included in a sub-layer of the second layer 208, while the doped semiconductor material may be included in another sub-layer of the second layer 208.

In an embodiment, the doped semiconductor material of the second layer 208 (e.g. the sub-layer including the doped semiconductor material of the second layer 208) may be proximal the top surface 202a of the substrate 202, and the undoped semiconductor material of the second layer 208 (e.g. the sub-layer including the undoped semiconductor material of the second layer 208) may be distal the top surface 202a of the substrate 202.

The doped semiconductor material of the second layer 208 (e.g. the sub-layer including the doped semiconductor material of the second layer 208) may have a constant doping profile or a graded doping profile. In an embodiment where the doped semiconductor material of the second layer 208 (e.g. the sub-layer including the doped semiconductor material of the second layer 208) may have a graded doping profile, a dopant concentration may be higher proximal the top surface 202a of the substrate 202, while the dopant concentration may be lower distal the top surface 202a of the substrate 202.

In an embodiment, a concentration of dopant atoms (e.g. phosphorus atoms) of the doped semiconductor material (e.g., doped silicon) of the second layer 208 may be in the range from about 0 atoms per cubic centimeter to about $1 \times 10^{18}$ atoms per cubic centimeter, although other concentrations of dopant atoms may be possible as well in accordance with other embodiments.

As described above, the second layer 208 may be formed (e.g., grown and/or deposited) by means of the epitaxial process 209. The epitaxial process 209 for forming the second layer 208 may include at least one of a liquid phase epitaxial process, a molecular beam epitaxial process, and a vapor phase epitaxial process. For example, in an embodiment, the second layer 208 may be formed (e.g., grown and/or deposited) by means of a vapor phase epitaxial process.

The epitaxial process 209 may include, or may be, at least one of a cyclic deposition etch (CDE) process and a selective epitaxial growth (SEG) process.

The epitaxial process 209 may be performed at a temperature in a range from about 600° C. to about 750° C., for example about 680° C.

The epitaxial process 209 may be performed with a precursor gas including the undoped semiconductor material. For example, in an embodiment where the undoped semiconductor material includes, or is, silicon, the precursor gas may include, or may be, at least one of silane ($SiH_4$), disilane ($Si_2H_6$), and dichlorosilane ($SiH_2Cl_2$).

In an embodiment, silane or disilane may be preferred over dichlorosilane, since silane or disilane may result in an increased deposition rate of undoped silicon in the epitaxial process 209.

In an embodiment, chlorine present during the epitaxial process 209 may help to desorb hydrogen from the top surface 206a of the first layer 206 and/or the top surface 202a of the substrate 202, thus promoting deposition and/or growth of the undoped semiconductor material (e.g. undoped silicon) of the second layer 208.

As described above, the second layer 208 may be formed over at least a portion of the recess. In an embodiment, a lateral extent L of the second layer 208 may be less than the width W of the recess 206. In another embodiment, the lateral extent L of the second layer 208 may be at least substantially equal to the width W of the recess 206.

In the example shown in FIG. 2C, the lateral extent L of the second layer 208 may be less than the width W of the recess 206. Further, the lateral extent L of the second layer 208 may be disposed within the width W of the recess 206. In another embodiment, the lateral extent L of the second layer 208 may be at least substantially equal to the width W of the recess 206, and the lateral extent L of the second layer 208 may completely overlap the width W of the recess 206.

Figure 2D:
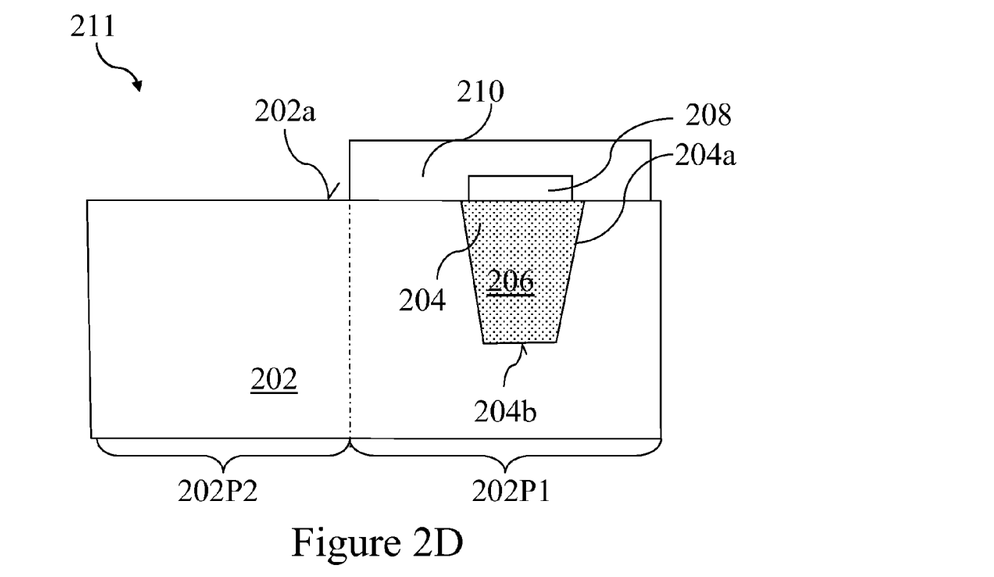

As shown in FIG. 2D in a cross-sectional view 211, the method 100 of manufacturing a semiconductor device may optionally include forming a mask layer 210 over the second layer 208 and a portion 202P1 of the substrate 202.

In one or more embodiments, the mask layer 210 may include, or may consist of, a dielectric material. In accordance with an embodiment, the mask layer 210 may include, or may consist of, at least one material selected from a group of materials, the group consisting of: an oxide, a nitride and an oxynitride, although other materials may be possible as well in accordance with other embodiments. For example, the mask layer 210 may include, or may consist of, silicon dioxide ($SiO_2$) and/or silicon nitride ($Si_3N_4$).

The substrate 202 may include another portion 202P2 that may be free from the mask layer 210. The portion 202P2 of the substrate 202 free from the mask layer 210 may be processed (e.g. etched) using the mask layer 210 as a processing mask (e.g. etch mask). In other words, the mask layer 210 may protect the second layer 208, the underlying first layer 204, and the portion 202P1 of the substrate 202 during a processing of the portion 202P2 of the substrate 202. The processing of the portion 202P2 is not shown in FIG. 2D.

Figure 2E:
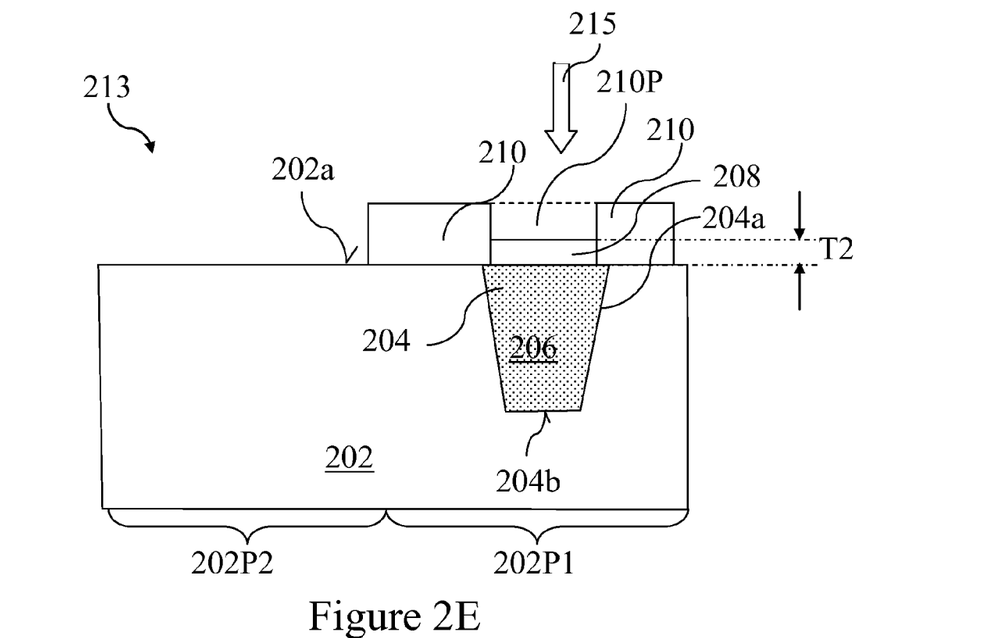

After processing of the portion 202P2 of the substrate 202, the second layer 208 may be exposed, e.g. by means of removing a portion 210P of the mask layer 210 disposed over the second layer 208, e.g., as shown in FIG. 2E in a cross-sectional view 213.

The portion 210P of the mask layer 210 disposed over the second layer 208 may be removed by means of a wet etch process (shown in FIG. 2E as arrow 215), which may be performed with an acid, e.g. hot phosphoric acid.

An effect provided by the second layer 208 including the undoped semiconductor material may be increased selectivity during removal of the portion 210P of the mask layer 210. For example, the undoped semiconductor material of the second layer 208 may be highly resistant to the wet etch process 215 (e.g. acid of the wet etch process 215, e.g. hot phosphoric acid of the wet etch process 215). Thus, the undoped semiconductor material of the second layer 208 is exposed to the wet etch process 215, and the underlying first layer 204 is protected by the second layer 208 from etch-induced material loss (e.g. SiP material loss).

As described above, in an embodiment where the second layer 208 may further include a doped semiconductor material (e.g. having a constant or graded doping profile), the undoped semiconductor material of the second layer 208 may be disposed distal the top surface 202a of the substrate 202, while the doped semiconductor material of the second layer 208 may be disposed proximal the top surface 202a of the substrate 202. In such an embodiment, the resistance of the second layer 208 to the wet etch process 215 is preserved since the undoped semiconductor material of the second layer 208, which overlies the doped semiconductor material of the second layer 208 and the underlying first layer 204, is exposed to the wet etch process 215. Thus, the underlying doped semiconductor material of the second layer 208 and the first layer 204 are protected by the undoped semiconductor material of the second layer 208 from etch-induced material loss (e.g. SiP material loss).

Figure 2F:
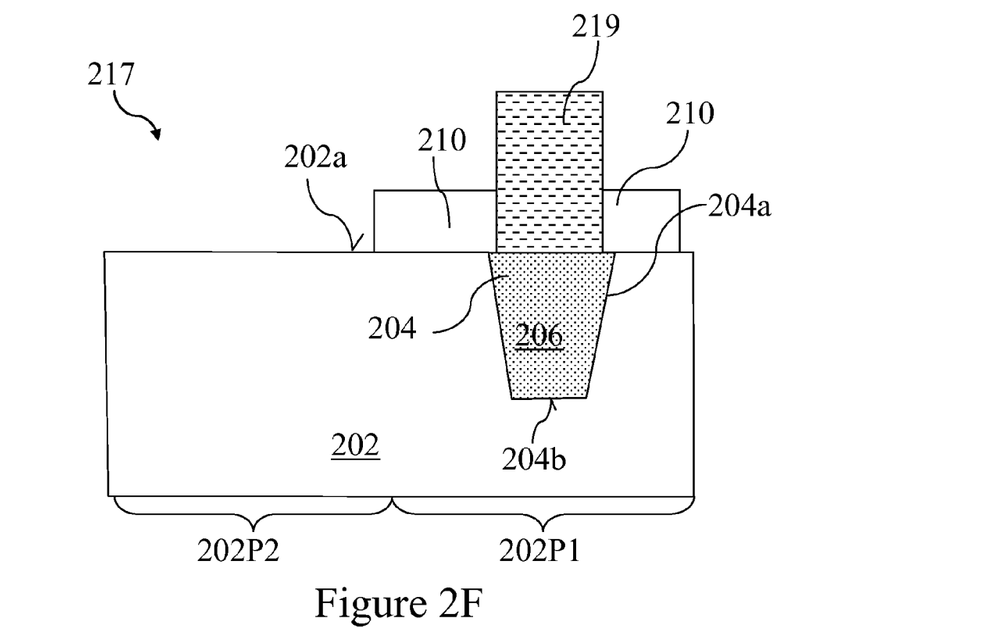

Subsequent to the process shown in FIG. 2E, an electrical contact 219 may be formed over the first layer 206, e.g. as shown in FIG. 2F in a cross-sectional view 217.

The electrical contact 219 may include a silicide layer (not shown in FIG. 2F), which may be in contact with (e.g. direct contact with, e.g. direct physical contact with) the top surface 206a of the first layer 206. The electrical contact 219 may be formed subsequent to exposing the top surface 206a of the first layer 206.

Exposing the top surface 206a of the first layer 206 may include removing at least a portion of the second layer 208 overlying the first layer 206. The portion of the second layer 208 overlying the first layer 206 may be removed during the wet etch process 215. Accordingly, the second layer 208 shown in FIG. 2E may be just thick enough to allow it to be substantially consumed or otherwise removed by the wet etch process 215, while leaving the underlying first layer 206 unperturbed. Therefore, an effect provided by the thickness T2 of the second layer 208 being in the above-described range from about 1 nanometer to about 6 nanometers may be prevention of a contact resistance penalty that may, for example, be caused by the second layer 208 being present during formation of the electrical contact 218 over the first layer 206, e.g. as shown in FIG. 2F.

Figure 3:
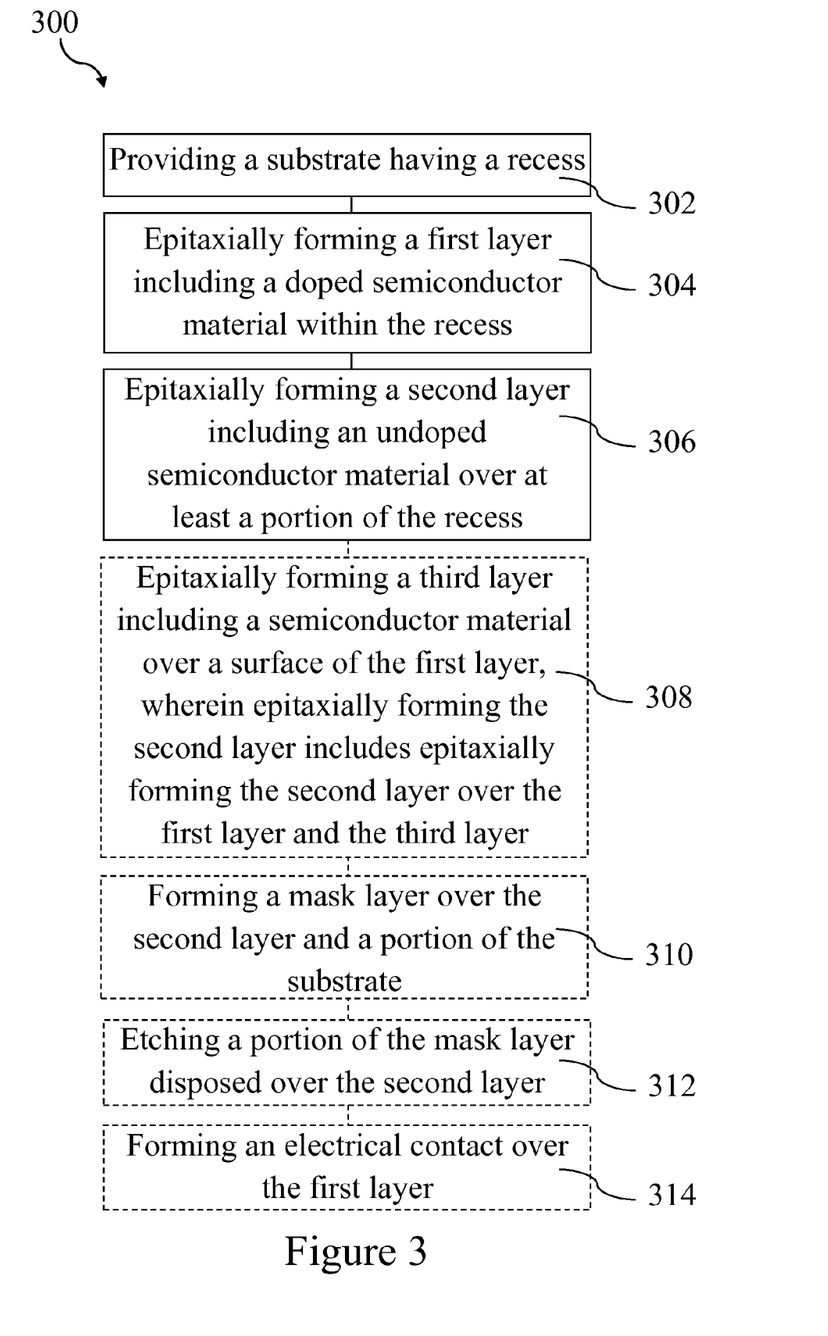
FIG. 3 shows a method of manufacturing a semiconductor device, in accordance with some embodiments.

FIG. 3 shows a method 300 of manufacturing a semiconductor device, in accordance with one or more embodiments.

The method 300 may include providing a substrate having a recess (in 302); epitaxially forming a first layer including a doped semiconductor material within the recess (in 304); and epitaxially forming a second layer including an undoped semiconductor material over at least a portion of the recess (in 306).

The method 300 may optionally include epitaxially forming a third layer including a semiconductor material over a surface of the first layer, wherein epitaxially forming the second layer includes epitaxially forming the second layer over the first layer and the third layer (in 308).

The method 300 may optionally include forming a mask layer over the second layer and a portion of the substrate (in 310); etching a portion of the mask layer disposed over the second layer (in 312); and forming an electrical contact over the first layer (in 312).

FIG. 4A to FIG. 4F show a process flow illustrating the method 300 of manufacturing a semiconductor device, in accordance with one or more embodiments.

Reference signs in FIG. 4A to FIG. 4F that are the same as in FIG. 2A to FIG. 2F denote the same or similar elements as in FIG. 2A to FIG. 2F. Thus, those elements will not be described in detail again here; reference is made to the description above. Differences between FIG. 4A to FIG. 4F and FIG. 2A to FIG. 2F are described below.

Figure 4A:
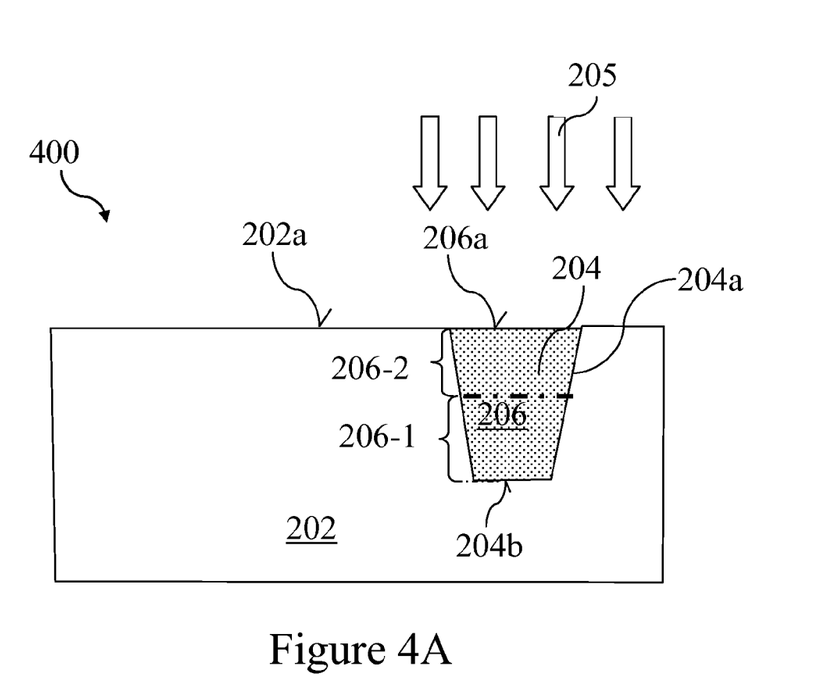

As shown in FIG. 4A in a cross-sectional view 400, the first layer 206 may be epitaxially formed within the recess 208, similarly as described above in connection with FIG. 2A to FIG. 2B.

Figure 4B:
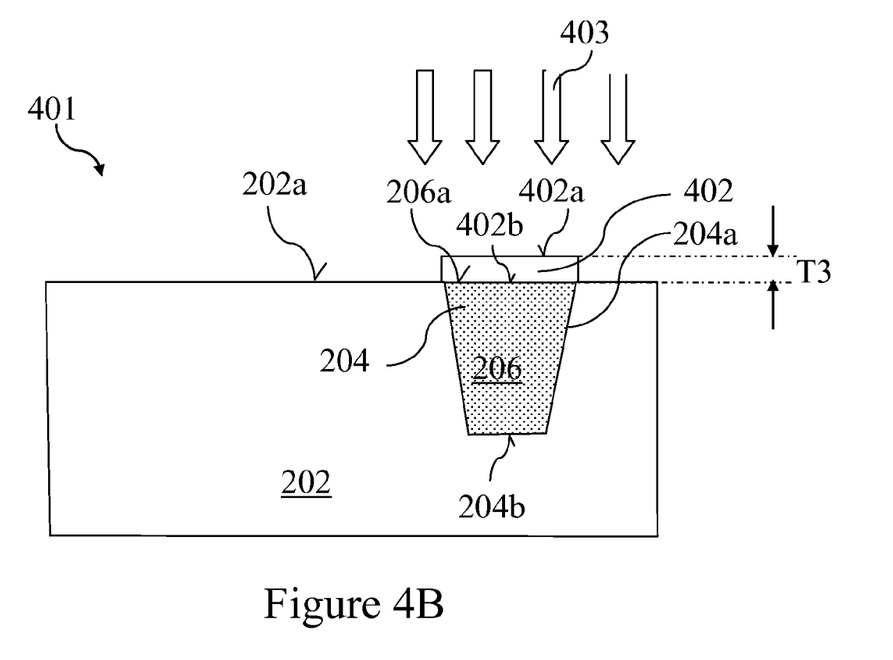

As shown in FIG. 4B in a cross-sectional view 401, the method 300 of manufacturing a semiconductor device may include epitaxially a third layer 402 including a semiconductor material over a surface (e.g. the top surface 206a) of the first layer 206. The epitaxial process for forming the third layer 402 is shown in FIG. 4B as arrows 403.

In the embodiment shown in FIG. 4B, the third layer 402 may have a top surface 402a that may be disposed at a level higher than the top surface 202a of the substrate 202. However, in another embodiment, the top surface 402a of the third layer 402 may be at least substantially flush with (i.e., co-planar with) the top surface 202a of the substrate (e.g., described below in respect of FIG. 7).

In the embodiment shown in FIG. 4B, a bottom surface 402b of the third layer 402 may be at least substantially flush with (i.e., co-planar with) the top surface 202a of the substrate. However, in another embodiment, the bottom surface 402b of the third layer 402 may be disposed at a level lower than the top surface 202a of the substrate 202 (e.g., described below in respect of FIG. 7).

In the embodiment shown in FIG. 4B, the bottom surface 402b of the third layer 402 may be in contact with (e.g. direct contact with, e.g. direct physical contact with) the top surface 206a of the first layer 206.

In the embodiment shown in FIG. 4B, the third layer 402 may be formed over the entire lateral extent of the top surface 206a of the first layer 206. In other words, the third layer 402 may completely cover the top surface 206a of the first layer 206 in the embodiment of FIG. 4B. However, in another embodiment, the third layer 402 may be formed over and may cover a portion of the top surface 206a of the first layer 206.

A thickness T3 of the third layer 402 may be measured from the bottom surface 402b to the top surface 402a of the third layer 402. The thickness T3 of the third layer 402 may be in a range from about 1 nanometer to about 5 nanometers, for example in a range from about 1 nanometer to about 3 nanometers or in a range from about 2 nanometers to about 5 nanometers.

The semiconductor material of the third layer 402 may include, or may be, a semiconductor material that may be formed (e.g., grown and/or deposited) by means of the epitaxial process 403. For example, in an embodiment, the semiconductor material of the third layer 402 may include at least one material selected from a group of materials, the group consisting of silicon carbide (SiC) and silicon phosphorus carbide (SiCP).

In an embodiment the third layer 402 may include carbon. A concentration of carbon in the third layer 402 may be in the range from about 0.5 mole percent to about 2 mole percent, for example about 1 mole percent, although other concentrations may be possible as well in accordance with other embodiments.

In an embodiment the semiconductor material of the third layer 402 may include dopant atoms (e.g. phosphorus atoms). A concentration of dopant atoms in the semiconductor material of the third layer 402 may be less than or equal to about $2 \times 10^{20}$ atoms per cubic centimeter, for example less than or equal to about $1 \times 10^{20}$ atoms per cubic centimeter. The concentration of dopant atoms in the semiconductor material of the third layer 402 may be chosen based on several factors, which are discussed below in respect of FIG. 4D.

As described above, the third layer 402 may be formed (e.g., grown and/or deposited) by means of the epitaxial process 403. The epitaxial process 403 for forming the second layer 208 may include at least one of a liquid phase epitaxial process, a molecular beam epitaxial process, and a vapor phase epitaxial process. For example, in an embodiment, the third layer 402 may be formed (e.g., grown and/or deposited) by means of a vapor phase epitaxial process.

The epitaxial process 403 may include, or may be, at least one of a cyclic deposition etch (CDE) process and a selective epitaxial growth (SEG) process.

The epitaxial process 403 may be performed at a temperature in a range from about 600° C. to about 750° C., for example about 680° C. The epitaxial process 403 may be performed with a precursor gas including the semiconductor material. For example, in an embodiment where the semiconductor material includes, or is, silicon, the precursor gas may include, or may be, at least one of silane ($SiH_4$), disilane ($Si_2H_6$), and dichlorosilane ($SiH_2Cl_2$).

In an embodiment, chlorine present in the epitaxial process 403 may help to desorb hydrogen from the top surface 206a of the first layer 206 and/or the top surface 202a of the substrate 202, thus promoting deposition and/or growth of the semiconductor material (e.g. silicon) of the third layer 402.

Figure 4C:
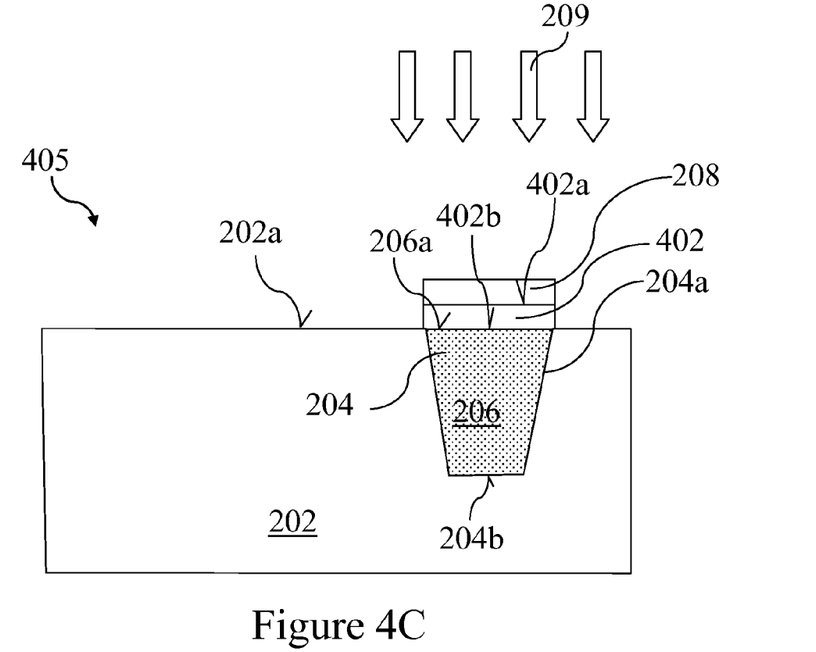

As shown in FIG. 4C in a cross-sectional view 405, the method 300 of manufacturing a semiconductor device may include epitaxially forming the second layer 208 including the undoped semiconductor material over the first layer 206 and the third layer 402. For example, the third layer 402 may be disposed between the first layer 206 and the second layer 208.

In the embodiment shown in FIG. 4C, the second layer 208 may be formed over the entire lateral extent of the top surface 402a of the third layer 402. In other words, the second layer 208 may completely cover the top surface 402a of the third layer 402 in the embodiment of FIG. 4B. However, in another embodiment, the second Layer 208 may be formed over and may cover a portion of the top surface 402a of the third layer 402.

Figure 4D:
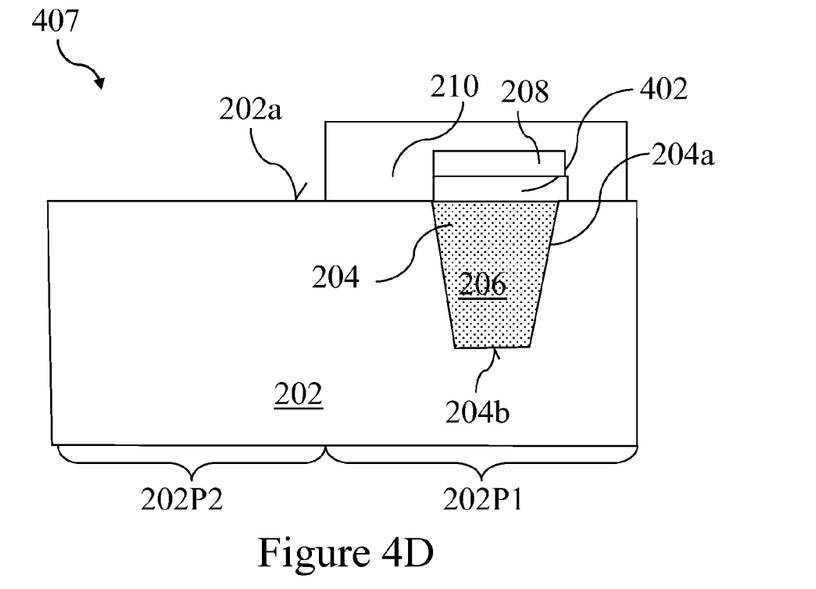

As shown in FIG. 4D in a cross-sectional view 407, the method 300 of manufacturing a semiconductor device may optionally include forming the mask layer 210 over the second layer 208 and the portion 202P1 of the substrate 202, similarly as described above in connection with FIG. 2D.

Figure 4E:
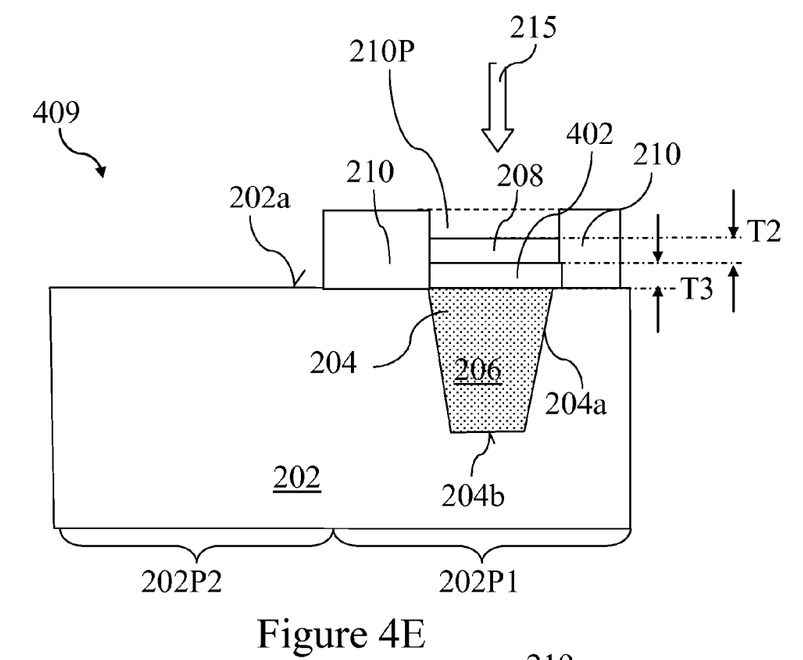

As shown in FIG. 4E in a cross-sectional view 409, the method 300 of manufacturing a semiconductor device may optionally include removing the portion 210P of the mask layer 210 disposed over the second layer 208, similarly as described above in connection with FIG. 2E.

The portion 210P of the mask layer 210 disposed over the second layer 208 may be removed by means of a wet etch process (shown in FIG. 4E as arrow 215), which may be performed with an acid, e.g. hot phosphoric acid.

An effect provided by the third layer 402 may be increased selectivity during removal of the portion 210P of the mask layer 210. For example, the third layer 402 may act as a barrier layer, which may prevent or reduce (e.g. by means or retarding) diffusion (e.g. up-hill diffusion) of dopant atoms from the doped semiconductor material of the underlying first layer 206 into the second layer 208. Accordingly, the undoped semiconductor material of the second layer 208 may remain free from dopant atoms with the help of the third layer 402 (e.g. barrier layer, e.g. diffusion barrier layer). Therefore, the second layer 208 may be highly resistant to the wet etch process 215 (e.g. acid of the wet etch process 215, e.g. hot phosphoric acid of the wet etch process 215). Consequently, the underlying first layer 204 is protected by the second layer 208 from etch-induced material loss (e.g. SiP material loss in the first layer 204).

As described above, the semiconductor material of the third layer 402 may include dopant atoms. These dopant atoms may be intentionally added during the epitaxial process 403. The concentration of dopant atoms in the semiconductor material of the third layer 402 may be chosen based on several factors such as, for example, an etch rate of the semiconductor material (e.g. silicon carbide) of the third layer 402, and a contact resistance of an electrical contact that may be subsequently formed over the first layer 206.

Figure 4F:
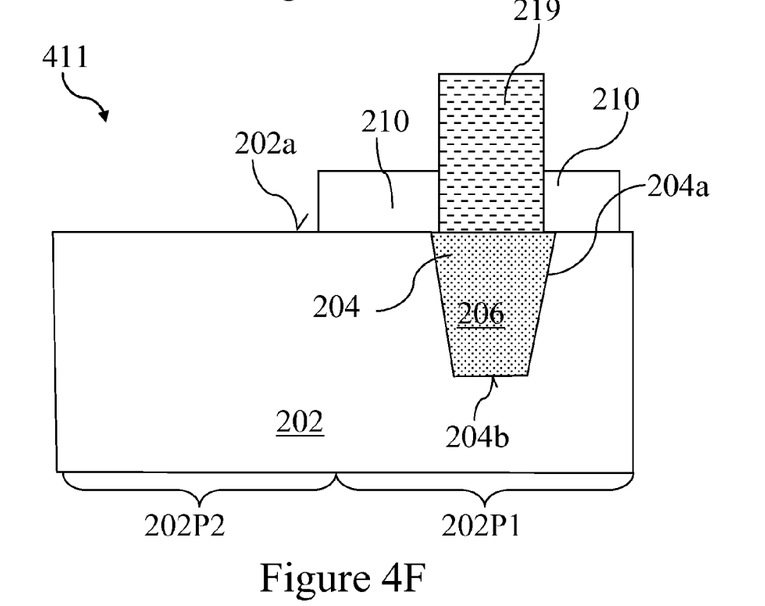

Subsequent to the process shown in FIG. 4E, an electrical contact 419 may be formed over the first layer 206, e.g. as shown in FIG. 4F in a cross-sectional view 411.

The electrical contact 419 may include a silicide layer (not shown in FIG. 4F), which may be in contact with (e.g. direct contact with, e.g. direct physical contact with) the top surface 206a of the first layer 206. The electrical contact 419 may be formed subsequent to exposing the top surface 206a of the first layer 206.

Exposing the top surface 206a of the first layer 206 may include removing at least a portion of the third layer 402 and the second layer 208 overlying the first layer 206. The portion of the third layer 402 and the second layer 208 overlying the first layer 206 may be removed during the wet etch process 215. Accordingly, the total thickness of the third layer 402 and the second layer 208 (i.e. a sum of thickness T2 and thickness T3) may be just enough to allow the third layer 402 and the second layer 208 to be consumed and/or removed by the wet etch process 215, while leaving the underlying first layer 206 unperturbed. Therefore, an effect provided by the thickness T2 of the second layer 208 being the in above-described range from about 1 nanometer to about 6 nanometers and the thickness T3 of the third layer 402 may be in a range from about 1 nanometer to about 5 nanometers may be prevention of a contact resistance penalty that may, for example, be caused by the second layer 208 being present during formation of the electrical contact over the first layer 206.

Figure 5:
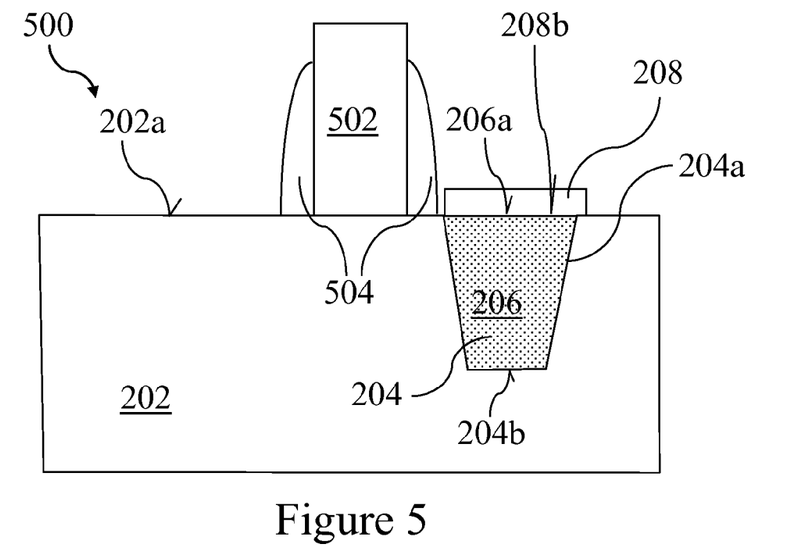

FIG. 5 shows a semiconductor device 500 in accordance with one or more embodiments.

Reference signs in FIG. 5 that are the same as in FIG. 2A to FIG. 2F and FIG. 4A to FIG. 4F denote the same or similar elements as in FIG. 2A to FIG. 2F and FIG. 4A to FIG. 4F. Thus, those elements will not be described in detail again here; reference is made to the description above.

The semiconductor device 500 may include a substrate 202 having a recess 204, a first layer 206 including a doped semiconductor within the recess 204, and a second layer 208 including an undoped semiconductor material over at least a portion of the recess 204.

In the embodiment shown in FIG. 5, the top surface 206a of the first layer 206 may be at least substantially flush with the top surface 202a of the substrate 202. Furthermore, in the embodiment shown in FIG. 5, the bottom surface 208b of the second layer 208 may be in contact with (e.g. direct contact with, e.g. direct physical contact with) the top surface 206a of the first layer 206.

The semiconductor device 500 may include a gate layer 502 (e.g. a metal gate layer and/or a polysilicon gate layer) disposed on the top surface 202a of the substrate and next to the recess 206. The semiconductor device 500 may further include an insulating layer 504 disposed on one or more sidewalls of the gate layer 502.

In an embodiment, the semiconductor device 500 may be a metal-oxide-semiconductor field-effect transistor (MOSFET). In another embodiment, the semiconductor device 500 may be a Fin field-effect transistor (FINFET).

Figure 6:
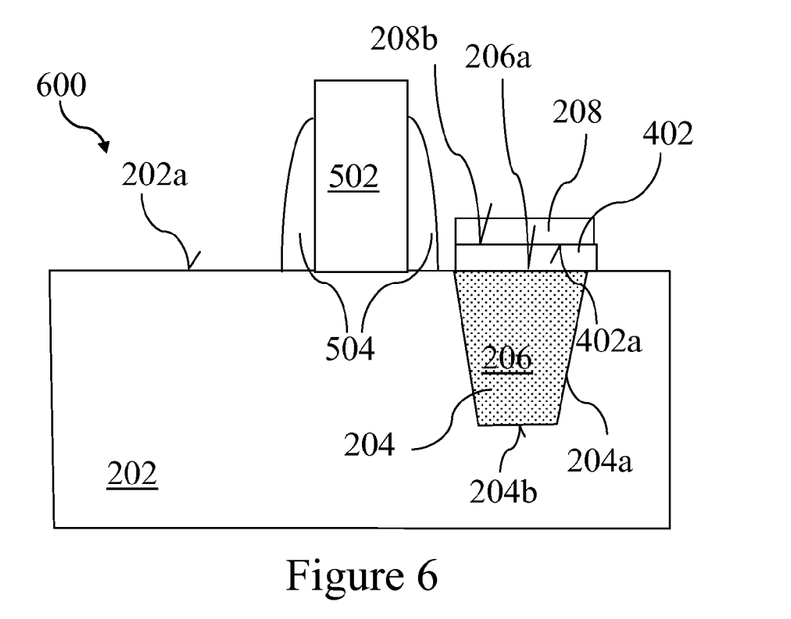

FIG. 6 shows a semiconductor device 600 in accordance with one or more embodiments.

Reference signs in FIG. 6 that are the same as in FIG. 2A to FIG. 2F, FIG. 4A to FIG. 4F, and FIG. 5 denote the same or similar elements as in FIG. 2A to FIG. 2F, FIG. 4A to FIG. 4F, and FIG. 5. Thus, those elements will not be described in detail again here; reference is made to the description above.

The semiconductor device 600 may include a substrate 202 having a recess 204, a first layer 206 including a doped semiconductor within the recess 204, a second layer 208 including an undoped semiconductor material over at least a portion of the recess 204, and a third layer 402 including a semiconductor material disposed between the first layer 206 and the second layer 208.

In the embodiment shown in FIG. 6, the third layer 402 may have a top surface 402a that may be disposed at a level higher than the top surface 202a of the substrate 202.

In the embodiment shown in FIG. 6, the bottom surface 208b of the second layer 208 may be disposed above, and may not be in contact with, the top surface 206a of the first layer 206.

In an embodiment, the semiconductor device 600 may be a metal-oxide-semiconductor field-effect transistor (MOSFET). In another embodiment, the semiconductor device 600 may be a Fin field-effect transistor (FINFET).

FIG. 7 shows a semiconductor device 700 in accordance with one or more embodiments.

Reference signs in FIG. 7 that are the same as in FIG. 2A to FIG. 2F, FIG. 4A to FIG. 4F, FIG. 5, and FIG. 6 denote the same or similar elements as in FIG. 2A to FIG. 2F, FIG. 4A to FIG. 4F, FIG. 5, and FIG. 6. Thus, those elements will not be described in detail again here; reference is made to the description above.

The semiconductor device 700 may include a substrate 202 having a recess 204, a first layer 206 including a doped semiconductor within the recess 204, a second layer 208 including an undoped semiconductor material over at least a portion of the recess 204, and a third layer 402 including a semiconductor material disposed between the first layer 206 and the second layer 208.

In the embodiment shown in FIG. 7, the first layer 206 may include a first sub-layer 206-1 and the second sub-layer 206-2 disposed over the first sub-layer 206-1. In the embodiment shown in FIG. 7, the top surfaces of the first sub-layer 206-1 and the second sub-layer 206-2 may conform to a contour or shape of the at least one sidewall 204a and bottom surface 204b of the recess 204.

In the embodiment shown in FIG. 7, the top surface 402a of the third layer 402 may be at least substantially flush with (i.e., co-planar with) the top surface 202a of the substrate.

In the embodiment shown in FIG. 7, the top surface 206a of the first layer 206 may be disposed at a level lower than the top surface 202a of the substrate 202.

In the embodiment shown in FIG. 7, the bottom surface 402b of the third layer 402 may be in contact with (e.g. direct contact with, e.g. direct physical contact with) the top surface 206a of the first layer 206. Accordingly, the bottom surface 402b of the third layer 402 may be disposed at a level lower than the top surface 202a of the substrate 202.

The bottom surface 402b may be slanted, e.g. as a result of the top surface of the first layer 206 conforming to a contour or shape of the at least one sidewall 204a and bottom surface 204b of the recess 204.

In an embodiment, the semiconductor device 700 may be a metal-oxide-semiconductor field-effect transistor (MOSFET). In another embodiment, the semiconductor device 700 may be a Fin field-effect transistor (FINFET).

According to various embodiments presented herein, an effect provided by the second layer 208 including the undoped semiconductor material may be increased selectivity during removal of the portion 210P of the mask layer 210. For example, the undoped semiconductor material of the second layer 208 may be highly resistant to the wet etch process 215 (e.g. acid of the wet etch process 215, e.g. hot phosphoric acid of the wet etch process 215). Thus, the undoped semiconductor material of the second layer 208 is exposed to the wet etch process 215, and the underlying first layer 204 is protected by the second layer 208 from etch-induced material loss (e.g. SiP material loss).

According to various embodiments presented herein, an electrical contact may be formed over the first layer 206, e.g. after exposing the top surface 206a of the first layer 206, e.g. by means of removing at least a portion of the second layer 208 overlying the first layer 206. The portion of the second layer 208 overlying the first layer 206 may be removed during the wet etch process 215. Accordingly, the second layer 208 may be just thick enough to allow it to be consumed and/or removed by the wet etch process 215, while leaving the underlying first layer 206 unperturbed. Therefore, an effect provided by the thickness T2 of the second layer 208 being the in above-described range from about 1 nanometer to about 6 nanometers may be prevention of a contact resistance penalty that may, for example, be caused by the second layer 208 being present during formation of the electrical contact over the first layer 206.

According to various embodiments presented herein, a third layer 402 may be disposed between the second layer 208 and the first layer 206. An effect provided by the third layer 402 may be increased selectivity during removal of the portion 210P of the mask layer 210. For example, the third layer 402 may act as a barrier layer, which may prevent or reduce (e.g. by means or retarding) diffusion (e.g. up-hill diffusion) of dopant atoms from the doped semiconductor material of the underlying first layer 206 into the second layer 208. Accordingly, the undoped semiconductor material of the second layer 208 may remain free from dopant atoms with the help of the third layer 402 (e.g. barrier layer, e.g. diffusion barrier layer). Therefore, the second layer 208 may be highly resistant to the wet etch process 215 (e.g. acid of the wet etch process 215, e.g. hot phosphoric acid of the wet etch process 215). Consequently, the underlying first layer 204 is protected by the second layer 208 from etch-induced material loss (e.g. SiP material loss in the first layer 204).

According to various embodiments presented herein, an electrical contact may be formed over the first layer 206, e.g. after exposing the top surface 206a of the first layer 206, e.g. by means of removing at least a portion of the third layer 402 and the second layer 208 overlying the first layer 206. The portion of the third layer 402 and the second layer 208 overlying the first layer 206 may be removed during the wet etch process 215. Accordingly, the total thickness of the third layer 402 and the second layer 208 (i.e. a sum of thickness T2 and thickness T3) may be just enough to allow the third layer 402 and the second layer 208 to be consumed and/or removed by the wet etch process 215, while leaving the underlying first layer 206 substantially unperturbed. Therefore, an effect provided by the thickness T2 of the second layer 208 being the in above-described range from about 1 nanometer to about 6 nanometers and the thickness T3 of the third layer 402 may be in a range from about 1 nanometer to about 5 nanometers may be prevention of a contact resistance penalty that may, for example, be caused by the second layer 208 being present during formation of the electrical contact over the first layer 206.

According to various embodiments presented herein, a method of manufacturing a semiconductor device is provided. The method may include providing a substrate having a recess; epitaxially forming a first layer comprising a doped semiconductor material within the recess; and epitaxially forming a second layer comprising an undoped semiconductor material over at least a portion of the recess.

According to various embodiments presented herein, a method of manufacturing a semiconductor device is provided. The method may include providing a substrate having a recess; epitaxially forming a first layer comprising a doped semiconductor material within the recess; epitaxially forming a second layer comprising an undoped semiconductor material over at least a portion of the recess; forming a mask layer over the second layer and a portion of the substrate; etching a portion of the mask layer disposed over the second layer; removing at least a portion of the second layer exposed by the etching; and forming an electrical contact over the first layer.

According to various embodiments presented herein, a semiconductor device is provided. The semiconductor device may include a substrate having a recess; a first layer comprising a doped semiconductor material within the recess; and a second layer comprising an undoped semiconductor material over at least a portion of the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:

providing a substrate having a recess;

epitaxially forming a first layer comprising a doped semiconductor material within the recess, the doped semiconductor material comprising silicon;

epitaxially forming a second layer comprising an undoped semiconductor material over at least a portion of the recess; and etching the second layer to substantially consume or otherwise remove the second layer.

2. The method of claim 1, wherein a thickness of the second layer is in a range from about 1 nanometer to about 6 nanometers.

3. The method of claim 1, wherein the undoped semiconductor material of the second layer comprises undoped silicon.

4. The method of claim 1, further comprising:
forming a mask layer over the second layer and a portion of the substrate; and
removing a portion of the mask layer disposed over the second layer.

5. The method of claim 4, wherein removing the portion of the mask layer comprises a wet etch process.

6. The method of claim 1, wherein the second layer further comprises a doped semiconductor material, wherein the undoped semiconductor material of the second layer is distal a top surface of the substrate and the doped semiconductor material of the second layer is proximal the top surface of the substrate.

7. The method of claim 6, wherein the doped semiconductor material of the second layer has a graded doping profile, wherein a dopant concentration is higher proximal the top surface of the substrate, and wherein the dopant concentration is lower distal the top surface of the substrate.

8. The method of claim 1, further comprising:
epitaxially forming a third layer comprising a semiconductor material over a surface of the first layer, wherein epitaxially forming the second layer comprises epitaxially forming the second layer over the first layer and the third layer.

9. The method of claim 8, wherein a top surface of the third layer is disposed above a top surface of the substrate.

10. The method of claim 8, wherein a top surface of the third layer is at least substantially flush with a top surface of the substrate.

11. The method of claim 8, wherein a thickness of the third layer is in a range from about 1 nanometer to about 5 nanometers.

12. The method of claim 8, wherein the semiconductor material of the third layer comprises at least one material selected from a group of materials, the group consisting of SiC and SiCP.

13. A method of manufacturing a semiconductor device, the method comprising:
providing a substrate having a recess;
epitaxially forming a first layer comprising a doped silicon containing material within the recess;
epitaxially forming a second layer comprising an undoped semiconductor material over at least a portion of the recess;
forming a mask layer over the second layer and a portion of the substrate;
etching a portion of the mask layer disposed over the second layer;
etching the second layer to substantially consume or otherwise remove the second layer, wherein a contact resistance penalty for subsequent electrical contact to the first layer is reduced; and
forming an electrical contact over the first layer.

14. The method of claim 13, wherein the mask layer comprises a nitride material.

15. The method of claim 13, wherein the undoped semiconductor material of the second layer comprises undoped silicon.

16. The method of claim 13, further comprising:
epitaxially forming a third layer comprising a semiconductor material over a surface of the first layer, wherein epitaxially forming the second layer comprises epitaxially forming the second layer over the first layer and the third layer.

17. A method of manufacturing a semiconductor device, the method comprising:
etching a recess in a top surface of a first region of a substrate;
forming a first layer in the recess using a first epitaxial process, the first layer comprising a doped semiconductor material and having a topmost surface with a first lateral width;
forming a second layer over a portion of the first layer using a second epitaxial process, the second layer comprising an undoped semiconductor material, and the second layer having a thickness in a range from about 1 nanometer to about 6 nanometers, the second layer having a bottommost surface having a second lateral width, the second lateral width being less than the first lateral width;
etching the second layer to remove the second layer and produce an exposed portion of the first layer; and
forming an electrical contact in contact with the exposed portion of the first layer.

18. The method of claim 17, wherein the second layer further comprises a doped semiconductor material, the doped semiconductor material of the second layer being proximal the top surface of the substrate and the undoped semiconductor material of the second layer being distal the top surface of the substrate.

19. The method of claim 17, wherein exposing the portion of the first layer comprises:
forming a mask layer over the first region of the substrate;
removing a portion of the mask layer to expose at least a portion of the second layer; and
etching the exposed portion of the second layer.

20. The method of claim 17, wherein the first epitaxial process comprises a first vapor phase epitaxial process, and wherein the second epitaxial process comprises at least one of a cyclic deposition etch process and a selective epitaxial growth process.

21. The method of claim 1, wherein etching the second layer entirely removes the second layer leaving the first layer unperturbed.

22. The method of claim 1, wherein the second layer is formed on at least a portion of the first layer.

23. The method of claim 1, further comprising, after etching the second layer to substantially consume the second layer, forming an electrical contact on a residual portion of the second layer.

24. The method of claim 1, further comprising, after etching the second layer to remove the second layer, forming an electrical contact on the first layer.

* * * * *